US012660362B2

(12) United States Patent
Lin et al.

(10) Patent No.: US 12,660,362 B2
(45) Date of Patent: Jun. 16, 2026

(54) DETECTION DEVICE

(71) Applicant: InnoCare Optoelectronics Corporation, Tainan City (TW)

(72) Inventors: Hsin-Hung Lin, Tainan City (TW); Sheng-I Chen, Tainan City (TW)

(73) Assignee: InnoCare Optoelectronics Corporation, Tainan City (TW)

( * ) Notice: Subject to any disclaimer, the term of this patent is extended or adjusted under 35 U.S.C. 154(b) by 595 days.

(21) Appl. No.: 17/969,700

(22) Filed: Oct. 20, 2022

(65) Prior Publication Data

US 2023/0147897 A1    May 11, 2023

Related U.S. Application Data

(60) Provisional application No. 63/277,165, filed on Nov. 9, 2021.

(30) Foreign Application Priority Data

Sep. 6, 2022    (TW) ................................. 111133651

(51) Int. Cl.
*H10F 71/00* (2025.01)
*G01T 1/166* (2006.01)
*H10F 77/14* (2025.01)

(52) U.S. Cl.
CPC ....... *H10F 71/1218* (2025.01); *G01T 1/1663* (2013.01); *H10F 71/138* (2025.01); *H10F 77/143* (2025.01)

(58) Field of Classification Search
CPC .. H10F 71/1218; H10F 71/138; H10F 77/143; H10F 77/146; H10F 77/206; H10F 30/223; H10F 39/1898; G01T 1/1663; G01T 1/2018
See application file for complete search history.

(56) References Cited

U.S. PATENT DOCUMENTS 5,034,794 A * 7/1991 Murotani .............. H10F 39/184
                                                        257/466
2004/0096031 A1  5/2004 Caria et al.
(Continued)

FOREIGN PATENT DOCUMENTS

CN        102100561 A      6/2011
CN        104921742        9/2015
(Continued)

OTHER PUBLICATIONS

"Office Action of Taiwan Counterpart Application", issued on Feb. 22, 2023, p. 1-p. 8.
(Continued)

*Primary Examiner* — Sitaramarao S Yechuri
(74) *Attorney, Agent, or Firm* — JCIPRNET

(57)    ABSTRACT
A detection device including a substrate, a switch element, a photoelectric element, and a scintillator is provided. The switch element is disposed on the substrate. The photoelectric element is disposed on the substrate and coupled to the switch element. The photoelectric element includes a semiconductor, and the semiconductor includes a monocrystalline material or a polycrystalline material. The scintillator is at least partially overlapped with the photoelectric element in a top view direction of the detection device.

16 Claims, 7 Drawing Sheets

(56) References Cited

U.S. PATENT DOCUMENTS

| 2004/0146138 A1* | 7/2004 | Jiao | G01T 1/20183 |
| | | | 378/19 |
| 2007/0290143 A1* | 12/2007 | Kameshima | H04N 25/677 |
| | | | 348/E5.081 |
| 2011/0095177 A1* | 4/2011 | Giannakopulos | H01J 49/025 |
| | | | 250/281 |
| 2013/0161522 A1 | 6/2013 | Ishida et al. | |
| 2013/0334639 A1* | 12/2013 | Kerwin | H10F 30/223 |
| | | | 257/E31.127 |
| 2014/0326892 A1* | 11/2014 | Ootorii | G01T 1/2023 |
| | | | 250/366 |

FOREIGN PATENT DOCUMENTS

| CN | 106653789 A | 5/2017 |
| CN | 108027448 | 5/2018 |
| TW | 200627302 | 8/2006 |
| TW | 201543653 | 11/2015 |
| TW | I734489 | 7/2021 |

OTHER PUBLICATIONS

"Office Action of China counterpart Application", issued on Oct. 16, 2025, p. 1-p. 11.

* cited by examiner

DETECTION DEVICE

CROSS-REFERENCE TO RELATED APPLICATION

This application claims the priority benefit of U.S. provisional application Ser. No. 63/277,165, filed on Nov. 9, 2021, and Taiwan application serial no. 111133651, filed on Sep. 6, 2022. The entirety of each of the above-mentioned patent applications is hereby incorporated by reference herein and made a part of this specification.

BACKGROUND

Technical Field

The disclosure relates to a detection device.

Description of Related Art

The detection layer of a detection device generally includes an amorphous silicon material. However, the amorphous silicon material has a large number of defects due to the crystal phase structure and forming process thereof, and the defects limit the movement of the carrier generated by the detection layer, and the carrier with restricted movement is not released until the subsequent operation of the detection device. As a result, the detected image is delayed or there is an issue of image sticking.

SUMMARY

The disclosure provides a detection device that may alleviate the issue of delayed image generation or image sticking in a detected image to improve detection performance.

According to an embodiment of the disclosure, a detection device includes a substrate, a switch element, a photoelectric element, and a scintillator. The switch element is disposed on the substrate. The photoelectric element is disposed on the substrate and coupled to the switch element. The photoelectric element includes a semiconductor, and the semiconductor includes a monocrystalline material or a polycrystalline material. The scintillator is at least partially overlapped with the photoelectric element in a top view direction of the detection device.

In order to make the aforementioned features and advantages of the disclosure more comprehensible, embodiments accompanied with figures are described in detail below.

DESCRIPTION OF THE EMBODIMENTS

Figure 1:
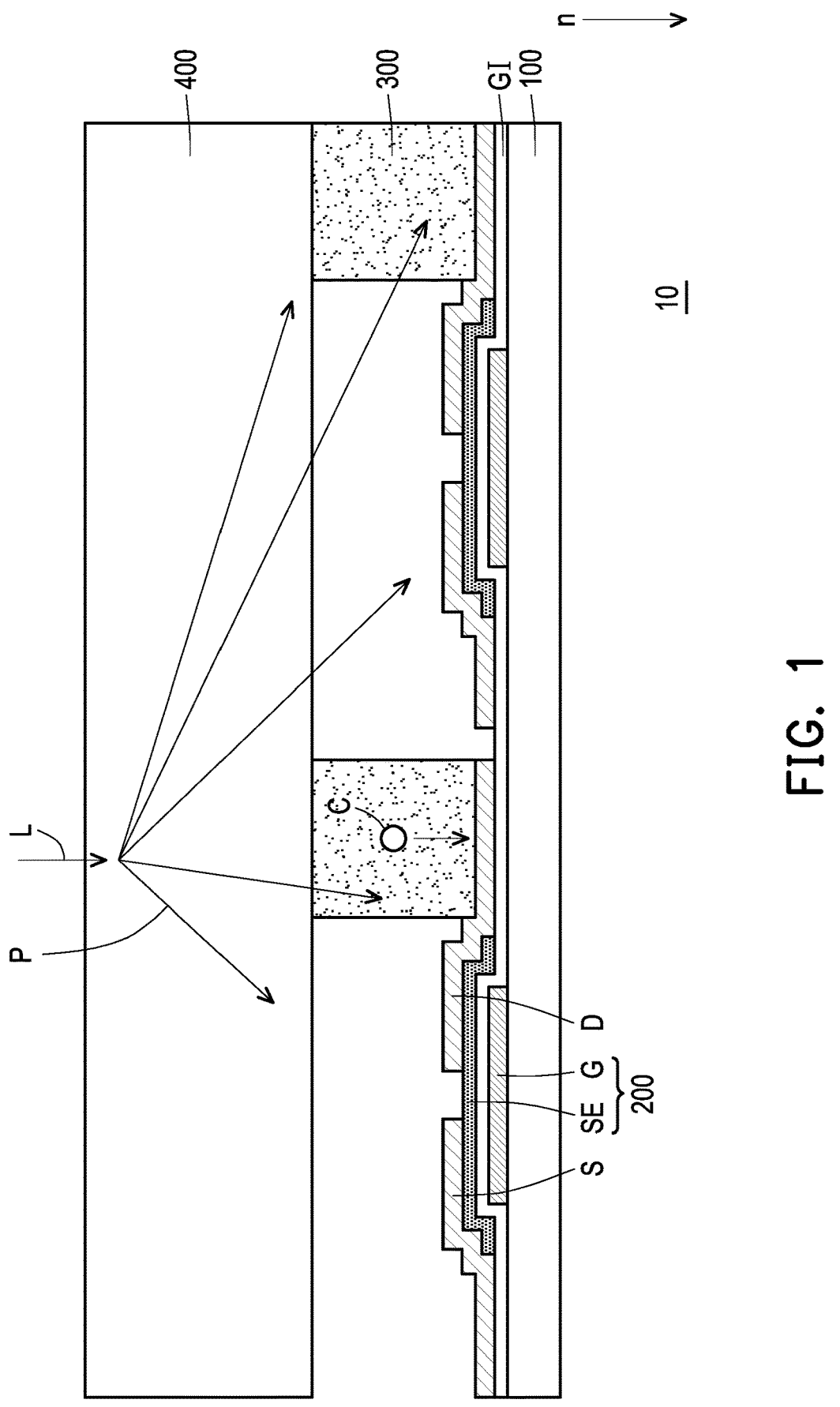
FIG. 1 is a schematic partial cross-sectional view of a detection device of an embodiment of the disclosure.

The disclosure may be understood by reference to the following detailed description taken in conjunction with the accompanying drawings. It should be noted that, in order to facilitate the reader's understanding and the simplicity of the figures, the multiple figures in the disclosure show a portion of an electronic device, and the specific elements in the figures are not drawn according to actual scale. In addition, the number and size of each element in the figures are for illustration, and are not used to limit the scope of the disclosure.

Throughout the disclosure, certain words are used to refer to specific elements in the specification and the appended claims. Those skilled in the art should understand that electronic device manufacturers may refer to the same elements by different names. The present specification does not intend to distinguish between elements that have the same function but different names. In the following specification and the claims, words such as "including", "containing", and "having" are open-ended words, so they should be interpreted as meaning "containing but not limited to . . . ". Therefore, the terms "including", "containing", and/or "having" used in the description of the disclosure specify the presence of corresponding features, regions, steps, operations, and/or members, but do not preclude the presence of one or a plurality of corresponding features, regions, steps, operations, and/or members.

In the present specification, wordings used to indicate direction, such as "up," "down," "front," "back," "left," and "right", merely refer to directions in the drawings. Therefore, the directional terms are used to illustrate and are not intended to limit the disclosure. In the drawings, the figures depict typical features of the methods, structures, and/or materials used in the particular embodiments. However, the figures are not to be interpreted as defining or limiting the scope or nature of the embodiments. For example, the relative size, thickness, and location of layers, regions, and/or structures may be reduced or enlarged for clarity.

When a corresponding member (e.g., a film layer or region) is referred to as being "on" another member, it may be directly on the other member or there may be other members in between. Moreover, when a member is said to be "directly on another member," then there is no member in between. Moreover, when a member is said to be "on another member", the two have a top-down relationship in the top view, and the member may be above or below the other member, and the top-bottom relationship depends on the orientation of the device.

The terms "about", "equal to", "equivalent" or "same", "substantially" or "roughly" are generally to be interpreted as within 20% of a given value or range, or interpreted as within 10%, 5%, 3%, 2%, 1%, or 0.5% of a given value or range.

The ordinal numbers used in the specification and claims, such as "first", "second", etc., are used to modify an element. They do not themselves imply and represent that the element(s) have any previous ordinal number, and also do not represent the order of one element and another element, or the order of manufacturing methods. The use of these ordinal numbers is to clearly distinguish an element with a certain name from another element with the same name. The claims and the specification may not use the same terms, and accordingly, a first member in the specification may be a second member in the claims.

It should be noted that the following embodiments may replace, recombine, and mix the features of several different embodiments without departing from the spirit of the disclosure to complete other embodiments. As long as the features between the embodiments do not violate the spirit of the disclosure or conflict with each other, they may be mixed and used arbitrarily.

The electrical connection or coupling described in the disclosure may refer to direct connection or indirect connection. In the case of direct connection, the endpoints of the elements on two circuits are directly connected or connected to each other via a conductor line segment. In the case of indirect connection, there are switches, diodes, capacitors, inductors, other suitable elements, or a combination of the above elements between the endpoints of the elements on two circuits. However, the disclosure is not limited thereto.

In the disclosure, the thickness, length, width may be measured by using an optical microscope, and the thickness may be measured by the cross-sectional image in an electron microscope, but the disclosure is not limited thereto. Moreover, a certain error may exist between any two competing values or directions. If a first value is equal to a second value, the first value and the second value may have a 10% error; if a first direction is perpendicular to a second direction, the angle between the first direction and the second direction may be between 80 degrees and 100 degrees; and if the first direction is parallel to the second direction, the angle between the first direction and the second direction may be between 0 degrees and 10 degrees.

An electronic device of the disclosure may include a detection device, a display device, an antenna device (such as a liquid-crystal antenna), a light-emitting touch device, a tiling device, a device having other suitable functions, or a combination of devices having the above functions, but the disclosure is not limited thereto. The electronic device includes, but is not limited to, a rollable or flexible electronic device. The electronic device may include, for example, a liquid crystal, a light-emitting diode (LED), a quantum dot (QD), fluorescence, phosphor, other suitable materials, or a combination of the above. The LED may include, for example, an organic LED (OLED), a micro LED, a mini LED, a QLED, or a QDLED, but the disclosure is not limited thereto. The electronic device may include an electronic element. The electronic element may include a passive element and an active element, such as a capacitor, a resistor, an inductor, a diode, a transistor, and the like. The diode may include a light-emitting diode or a photodiode. The LED may include, for example, an OLED, a mini LED, a micro LED, or a quantum dot (QD) LED such as QLED or QDLED, or other suitable materials or any combination of the above materials, but the disclosure is not limited thereto. It should be noted that the electronic device may be any arrangement and combination of the above, but the disclosure is not limited thereto. In addition, the shape of the electronic device may be rectangular, circular, polygonal, a shape having a curved edge, or other suitable shapes. The electronic device may have a peripheral system such as a driving system, a control system, a light source system, a shelf system, etc. to support a display device or a tiling device. It should be noted that the electronic device may be any arrangement and combination of the above, but the disclosure is not limited thereto. The electronic device may include a plurality of components, and at least two components may be assembled to form a composite article. Hereinafter, the detection device is used as an electronic device to explain the disclosure, but the disclosure is not limited thereto.

The following exemplifies the exemplary embodiments of the disclosure. The same reference numerals are used in the drawings and description to represent the same or similar parts.

FIG. 1 is a schematic partial cross-sectional view of a detection device of an embodiment of the disclosure.

Referring to FIG. 1, a detection device 10 of the present embodiment includes a substrate 100, a switch element 200, a photoelectric element 300, and a scintillator 400.

The material of the substrate 100 may include a hard material, a soft material, or a combination thereof. For example, the material of the substrate 100 may include quartz, sapphire, polymethyl methacrylate (PMMA), polycarbonate (PC), polyimide (PI), polyethylene terephthalate (PET), or other suitable materials or a combination of the above materials, but the disclosure is not limited thereto.

The switch element 200 is, for example, disposed on the substrate 100. In some embodiments, the switch element 200 includes a gate G and a semiconductor layer SE, but the disclosure is not limited thereto. The gate G is, for example, disposed on the substrate 100. The material of the gate G may include, for example, molybdenum (Mo), titanium (Ti), tantalum (Ta), niobium (Nb), hafnium (Hf), nickel (Ni), chromium (Cr), cobalt (Co), zirconium (Zr), tungsten (W), aluminum (Al), copper (Cu), silver (Ag), other suitable metals, or an alloy or a combination of the above materials, but the disclosure is not limited thereto. The semiconductor layer SE is disposed on the gate G, for example. In some embodiments, a gate insulating layer GI may be disposed between the semiconductor layer SE and the gate G. Specifically, the gate insulating layer GI may, for example, cover the gate G in a top view direction n of the substrate 100, and the semiconductor layer SE may, for example, be at least partially overlapped with the gate G in the top view direction n of the substrate 100. In some embodiments, the material of the semiconductor layer SE may include silicon, such as low-temperature polysilicon (LTPS) or amorphous silicon (a-Si), but the disclosure is not limited thereto. For example, the material of the semiconductor layer SE may include, but not limited to, amorphous silicon, polysilicon, germanium, compound semiconductor (such as gallium nitride, silicon carbide, gallium arsenide, gallium phosphide, indium phosphide, indium arsenide, and/or indium antimonide), alloy semiconductor (for example SiGe alloy, GaAsP alloy, AlInAs alloy, AlGaAs alloy, GaInAs alloy, GaInP alloy, GaInAsP alloy), or a combination of the above. The material of the semiconductor layer SE may also include, but not limited to, metal oxide, such as indium gallium zinc oxide (IGZO), indium zinc oxide (IZO), indium gallium zinc oxide (IGZTO), or an organic semiconductor including a polycyclic aromatic compound, or a combination of the above. In an embodiment, the detection device 10 may include a plurality of switch elements 200, and different switch elements 200 may include semiconductor layers SE of the same material or semiconductor layers SE of different materials, but the disclosure is not limited thereto. In some embodiments, the switch element 200 may include a source S and a drain D. For example, the source S and the drain D are disposed on the semiconductor layer SE and separated from each other, and are in direct contact with and coupled to the semiconductor layer SE, but the disclosure is not limited thereto. In other embodiments, an insulating layer is disposed between the semiconductor layer SE and the source S and the drain D, wherein the insulating layer has a through hole, and the source S and the drain D may be coupled to the semiconductor layer SE via the through hole. It should be noted that although the present embodiment shows that the switch element 200 is a bottom-gate structure, such as a bottom-gate TFT, the disclosure is not limited thereto. In other embodiments, the switch element 200 may be a top-gate structure or other suitable forms of TFTs known to those skilled in the art.

The photoelectric element 300 is, for example, disposed on the substrate 100 and coupled to the switch element 200. In the present embodiment, the photoelectric element 300 includes a semiconductor, wherein the semiconductor includes a monocrystalline material or a polycrystalline material. For example, the material of the semiconductor of the photoelectric element 300 includes, for example, germanium (Ge), indium phosphide (InP), gallium arsenide (GaAs), cadmium telluride (CdTe), aluminum gallium indium phosphide (AlGaInP), indium gallium arsenide (InGaAs), cadmium sulfide (CdS), monocrystalline silicon (mono-Si), polycrystalline silicon (poly-Si), or a combination thereof. In some embodiments, the photoelectric element 300 is coupled to the switch element 200. In some embodiments, the photoelectric element 300 may be coupled to the switch element 200 via the drain D. Specifically, the semiconductor of the photoelectric element 300 may receive a light P and generate a carrier C (e.g., an electron and/or a hole), and the carrier C is stored in the photoelectric element 300 when the switch element 200 is not turned on. After the switch element 200 is turned on, the carrier C stored in the photoelectric element 300 may be transmitted to the processing circuit via, for example, a read line coupled to the switch element 200, so as to implement the function of light detection. In some embodiments, the read line may be a data line DL described later, but the disclosure is not limited thereto. Since the semiconductor of the photoelectric device 300 includes the above materials, the situation of restricting the movement of the carrier C may be alleviated, thereby improving the detection performance of the detection device 10. It should be noted that the structure of the photoelectric element 300 is described in detail in the following embodiments.

The scintillator 400 is disposed on the substrate 100, for example. In some embodiments, the scintillator 400 is disposed corresponding to the photoelectric element 300. Specifically, in the top view direction of the detection device 10 (e.g., the top view direction n of the substrate 100), the scintillator 400 and the photoelectric element 300 are at least partially overlapped. The scintillator 400 may receive an electromagnetic wave L and generate the light P, for example. For example, the electromagnetic wave L may be invisible light, and the scintillator 400 may convert the received invisible light (e.g., X-ray) into visible light. Therefore, in some embodiments, the detection device 10 may be an X-ray detection device, but the disclosure is not limited thereto. The material of the scintillator 400 may include $Lu_2S_3:Ce^{3+}$, $LaBr_3:PR^{3+}$, CsI:TI, $Y_3Al_5O_{12}:Ce$, $Lu_3Al_5O_{12}:Ce$, $Bi_4Ge_3O_{12}$, $PbWO_4$, $Gd:SiO_5:Ce$, or a combination thereof. In addition, although the present embodiment shows that the photoelectric element 300 is located between the scintillator 400 and the substrate 100, the disclosure is not limited thereto. In other embodiments, the scintillator 400 may be located between the photoelectric element 300 and the substrate 100.

Figure 2A:
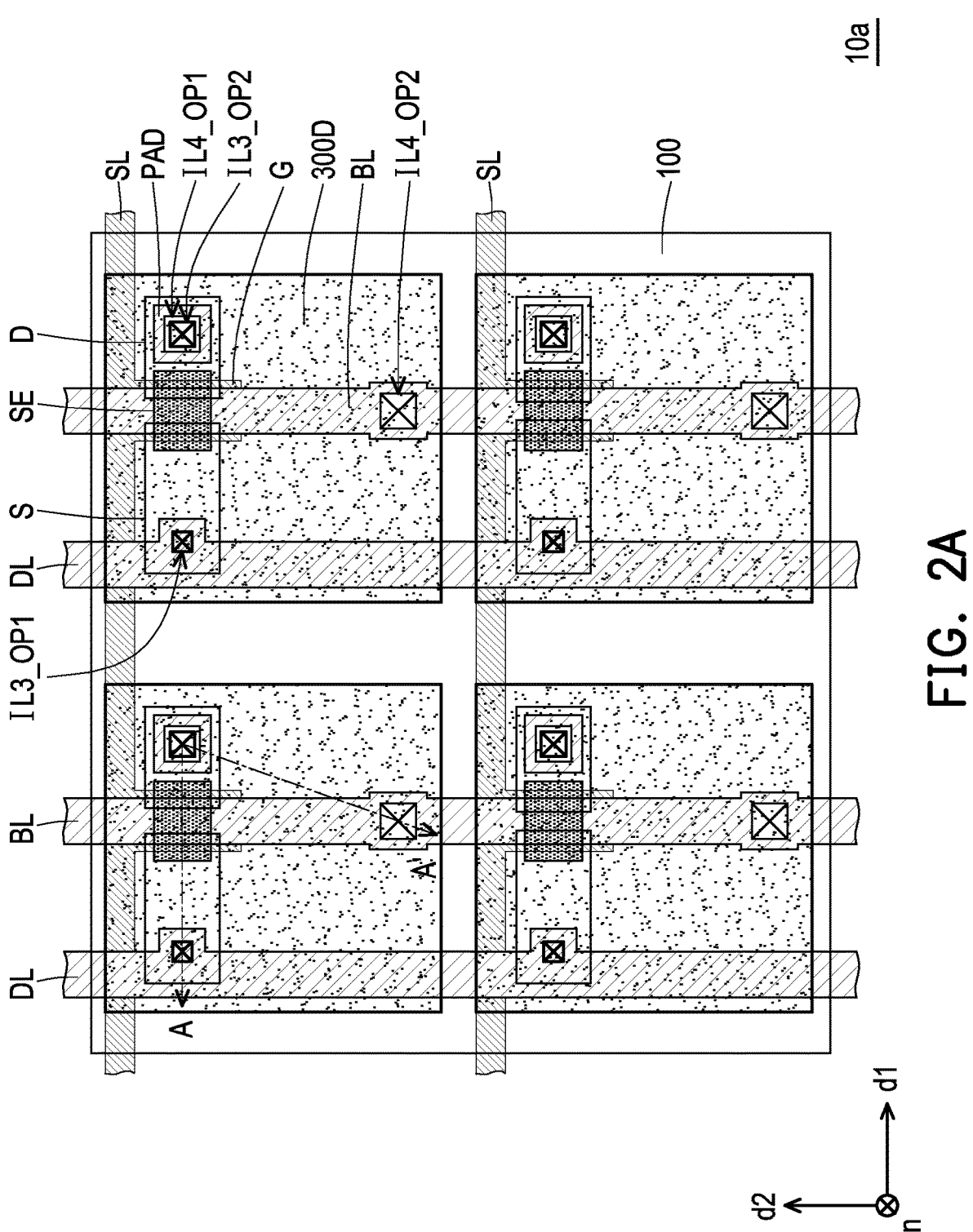
FIG. 2A is a schematic partial top view of a detection device of an embodiment of the disclosure.
Figure 2B:
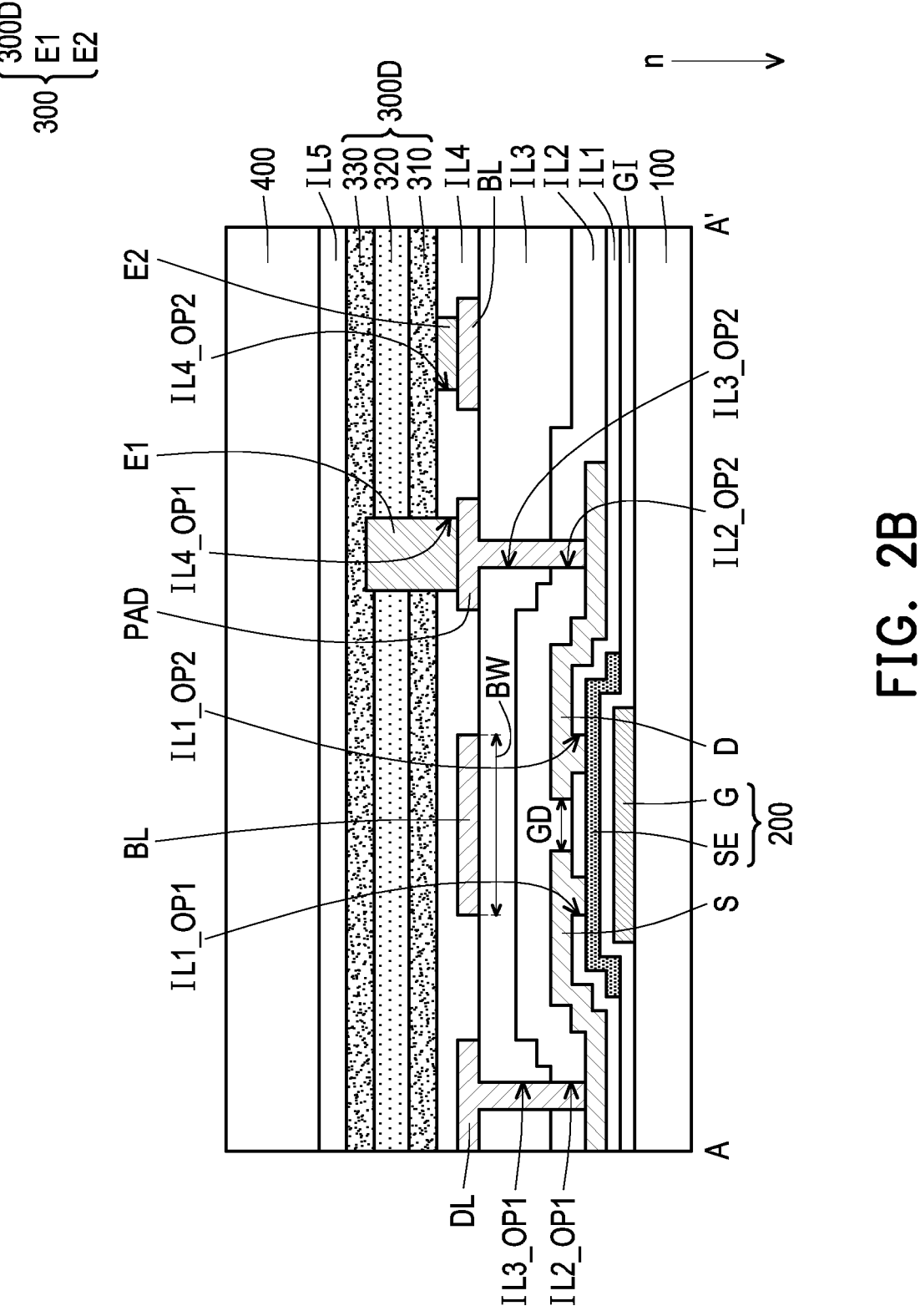
FIG. 2B is a schematic cross-sectional view along section line A-A' of FIG. 2A.

FIG. 2A is a partial top schematic view of a detection device of an embodiment of the disclosure, and FIG. 2B is a schematic cross-sectional view according to section line A-A' of FIG. 2A. It should be mentioned that, the embodiments of FIG. 2A and FIG. 2B may adopt the reference numerals of the embodiment of FIG. 1 and a portion of the contents thereof, wherein the same or similar numerals are used to represent the same or similar elements and descriptions of the same technical contents are omitted.

A detection device 10a of the present embodiment includes, for example, the substrate 100, the switch element 200, the photoelectric element 300, and the scintillator 400. In some embodiments, the detection device 10a further includes a scan line SL, a voltage line BL, and the data line DL. The materials of the scan line SL, the voltage line BL, and the data line DL are as provided for the material of the gate G, and are not repeated herein. The scan line SL is, for example, disposed on the substrate 100 and coupled to the gate G of the switch element 200, wherein the scan line SL may be used, for example, to provide a scan signal to the corresponding switch element 200 to be turned on. In some embodiments, the scan line SL is extended toward a first direction d1. The voltage line BL is, for example, disposed on the substrate 100 and coupled to the photoelectric element 300, wherein the voltage line BL may be used, for example, to apply a voltage level to the photoelectric element 300. In some embodiments, the voltage line BL is extended toward a second direction d2, wherein the first direction d1 is different from the second direction d2. In the present embodiment, the first direction d1 and the second direction d2 are orthogonal, but the disclosure is not limited thereto. The data line DL is, for example, disposed on the substrate 100 and coupled to the source S of the switch element 200, wherein the signal (carrier) generated by the photoelectric element 300 may be transmitted to the data line DL via the source S, and the data line DL may transmit the signal (carrier) to a processing circuit (not shown). In some embodiments, the data line DL is also extended toward the second direction d2. In the present embodiment, the voltage line BL and the data line DL belong to the same layer, so the voltage line BL and the switch element 200 may be disposed on the same side of the photoelectric element 300 adjacent to the substrate 100, but the disclosure is not limited thereto. In the present embodiment, a width BW of the voltage line BL is greater than a spacing GD between the source S and the drain D. For example, in any cross-sectional view of the detection device 10a, for example, in a cross-sectional view parallel to the extending direction of the scan line SL (i.e., the first direction d1), the width BW of the voltage line BL is greater than the spacing GD between the source S and the drain D.

In addition, in the detection device 10a of the present embodiment, the photoelectric element 300 may include a chip that may include a bare chip or a bare chip packaged element. In detail, the photoelectric element 300 of the present embodiment includes a semiconductor 300D, an electrode E1, and an electrode E2. The semiconductor 300D includes, for example, a first layer 310, an intrinsic layer 320, and a second layer 330, and the first layer 310, the intrinsic layer 320, and the second layer 330 are stacked in this order in the top view direction n of the substrate 100. In some embodiments, the semiconductor 300D may be directly formed on the substrate 100 by an epitaxial process or by transferring a chip and disposed on the substrate 100 by bonding, but the disclosure is not limited thereto. The electrode E1 and the electrode E2 are each coupled to the second layer 330 and the first layer 310, for example. The semiconductor 300D may include the above monocrystalline material or polycrystalline material, which is not repeated herein. In the present embodiment, the first layer 310 includes an N-type gallium arsenide semiconductor, the intrinsic layer 320 includes a gallium arsenide multiple quantum well semiconductor, and the second layer 330 includes a P-type gallium arsenide semiconductor, but the disclosure is not limited thereto. In other embodiments, the first layer 310 includes a P-type gallium arsenide semiconductor, the intrinsic layer 320 includes a gallium arsenide multiple quantum well semiconductor, and the second layer 330 includes an N-type gallium arsenide semiconductor. In some embodiments, the electrode E1 and the electrode E2 include a transparent conductive material, which may be indium tin oxide, but the disclosure is not limited thereto. In addition, the electrode E2 is coupled to the voltage line BL, for example. The electrode E1 is coupled to the switch element 200 via the drain D, for example, so that the carrier generated by the intrinsic layer 320 may be transferred to the drain D via the electrode E2, and then may be transmitted to the data line DL via the switch element 200 and via the source S. In the detection device 10*a* of some embodiments, the semiconductor 300D of the photoelectric device 300 may be formed via a thin film process, and the semiconductor 300D, the electrode E1, and the electrode E2 of the photoelectric device 300 may also be formed via a thin film process.

In addition, the detection device 10*a* of the present embodiment further includes an insulating layer ILL an insulating layer IL2, an insulating layer IL3, a pad PAD, an insulating layer IL4, and an insulating layer IL5.

The insulating layer IL1 is disposed on, for example, the gate insulating layer GI. In the present embodiment, the insulating layer IL1 partially covers the semiconductor layer SE. Specifically, the insulating layer IL1 has a through hole IL1_OP1 and a through hole IL1_OP2 exposing a portion of the semiconductor layer SE, wherein the source S and the drain D are disposed on the insulating layer IL1 and respectively coupled to the semiconductor layer SE of the switch element 200 via the through hole IL1_OP1 and the through hole IL1_OP2, but the disclosure is not limited thereto. The material of the insulating layer IL1 may include, for example, an inorganic material (for example: silicon oxide, silicon nitride, silicon oxynitride, or stacked layers of at least two of the above materials), an organic material (for example, polyimide resin, epoxy resin, or acrylic resin), or a combination thereof, but the disclosure is not limited thereto.

The insulating layer IL2 is disposed on, for example, the insulating layer IL1. In the present embodiment, the insulating layer IL2 partially covers the source S and the drain D. In detail, the insulating layer IL2 has a through hole IL2_OP1 exposing a portion of the source S and a through hole IL2_OP2 exposing a portion of the drain D, but the disclosure is not limited thereto. For the material of the insulating layer IL2, reference may be made to the material of the insulating layer IL1, and is not repeated herein. In some embodiments, the material of the insulating layer IL2 and the material of the insulating layer IL1 may be the same, and in other embodiments, the material of the insulating layer IL2 and the material of the insulating layer IL1 may be different.

The insulating layer IL3 is disposed on, for example, the insulating layer IL2. In the present embodiment, the insulating layer IL3 also has a through hole IL3_OP1 exposing a portion of the source S and a through hole IL3_OP2 exposing a portion of the drain D. Specifically, the through hole IL3_OP1 and the through hole IL3_OP2 included in the insulating layer IL3 are respectively disposed corresponding to the through hole IL2_OP1 and the through hole IL2_OP2 included in the insulating layer IL2, so that the insulating layer IL3 and the insulating layer IL2 may together expose a portion of the source S and the drain D. The material of the insulating layer IL3 may be, for example, an organic material, for example: polyimide-based resin, epoxy-based resin, or acrylic-based resin, or a combination of the above, and can, for example, make the film layer subsequently formed thereon have better flatness. In the present embodiment, the data line DL is disposed on the insulating layer IL3 and coupled to the source S via the through hole IL2_OP1 and the through hole IL3_OP1, and the voltage line BL is also disposed on the insulating layer IL3 because the voltage line BL belongs to the same layer as the data line DL.

The pad PAD is disposed on the insulating layer IL3, for example. In the present embodiment, the pad PAD, the voltage lines BL, and the data lines DL belong to the same layer. The pad PAD may be used, for example, to couple the electrode E1 with the switch element 200. Specifically, the pad PAD may be coupled to the drain D via the through hole IL2_OP2 of the insulating layer IL2 and the through hole IL3_OP2 of the insulating layer IL3, and the electrode E1 is coupled to the pad PAD, and the drain D is further coupled to the switch element 200.

The insulating layer IL4 is disposed on, for example, the insulating layer IL3. In the present embodiment, the insulating layer IL4 partially covers the pad PAD and the voltage line BL. Specifically, the insulating layer IL4 has a through hole IL4_OP1 exposing a portion of the pad PAD and a through hole IL4_OP2 exposing a portion of the voltage line BL, wherein the electrode E1 is coupled to the pad PAD via the through hole IL4_OP1, and the electrode E2 is coupled to the voltage line BL via the through hole IL4_OP2, but the disclosure is not limited thereto. For the material of the insulating layer IL4, reference may be made to the material of the insulating layer IL1, and is not repeated herein.

The insulating layer IL5 is disposed on, for example, the insulating layer IL4. In the present embodiment, the insulating layer IL5 may cover the semiconductor 300D, and may be used to protect the semiconductor 300D. In addition, the scintillator 400 is disposed on the insulating layer IL5, for example. For the material of the insulating layer IL5, reference may be made to the material of the insulating layer IL1, and is not repeated herein.

Figure 3A:
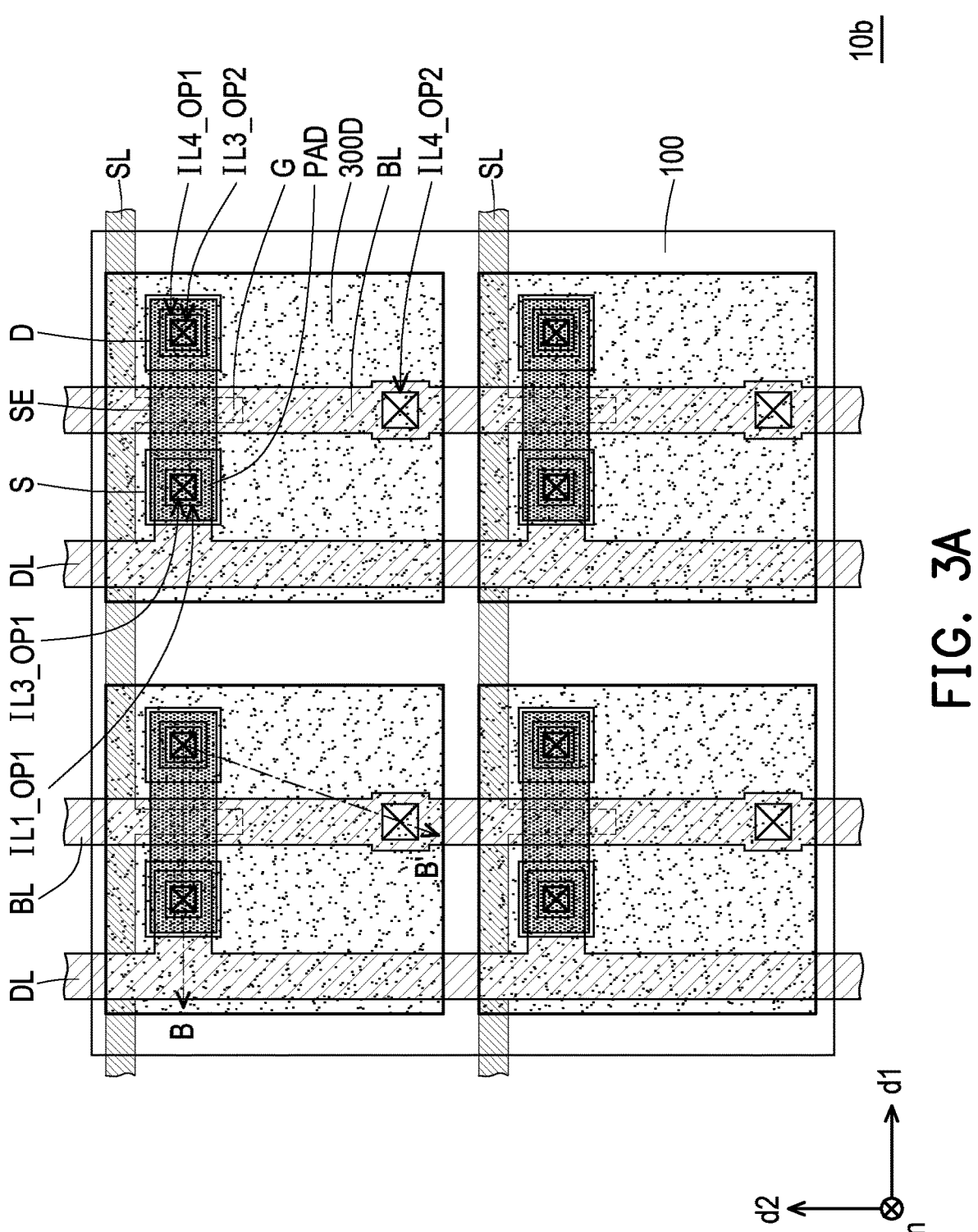
FIG. 3A is a schematic partial top view of a detection device of another embodiment of the disclosure.
Figure 3B:
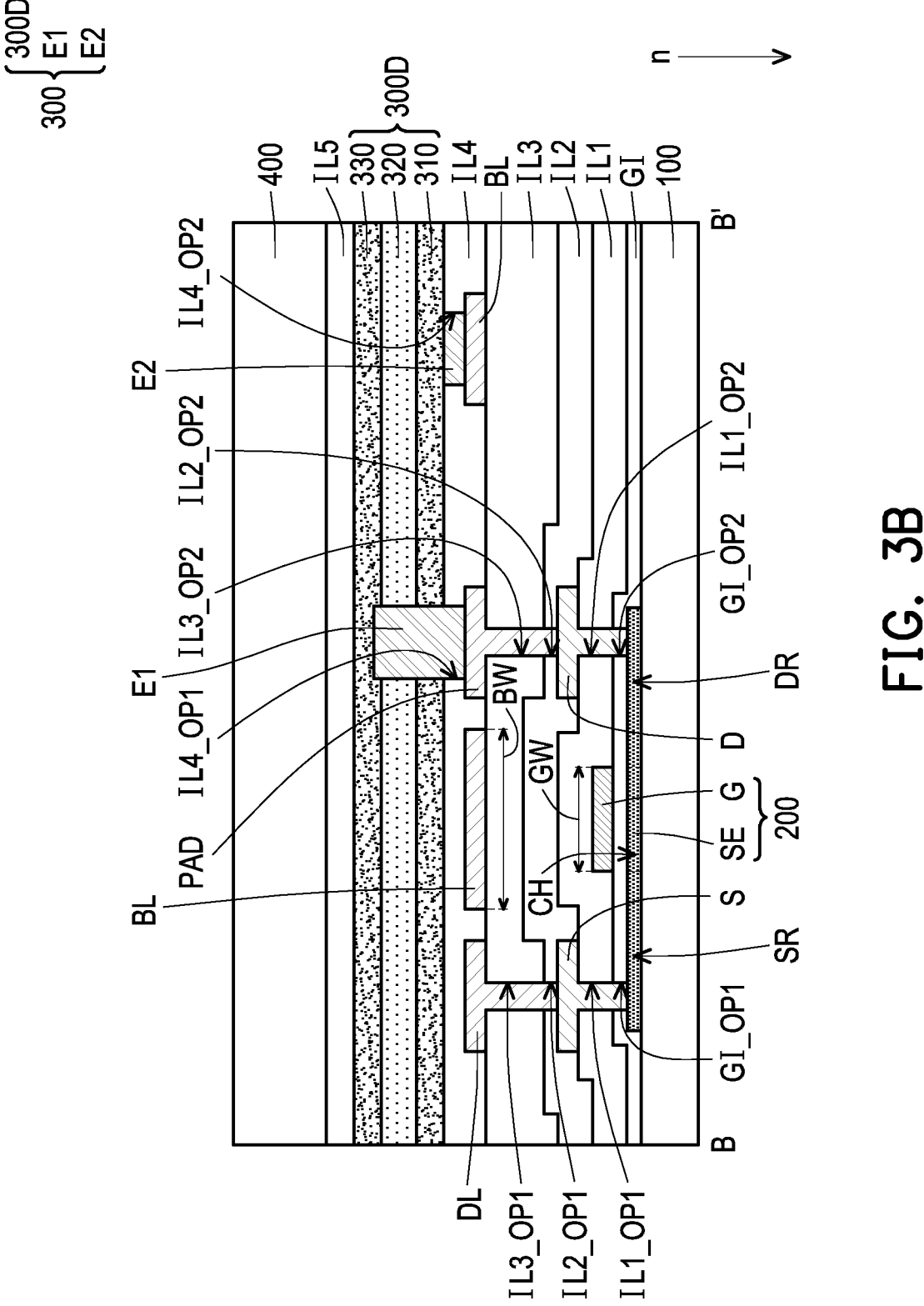
FIG. 3B is a schematic cross-sectional view along section line B-B' of FIG. 3A.

FIG. 3A is a partial top schematic view of a detection device of another embodiment of the disclosure, and FIG. 3B is a schematic cross-sectional view according to section line B-B' of FIG. 3A. It should be mentioned that, the embodiments of FIG. 3A and FIG. 3B may respectively adopt the reference numerals of the embodiments of FIG. 2A and FIG. 2B and a portion of the contents thereof, wherein the same or similar numerals are used to represent the same or similar elements and descriptions of the same technical contents are omitted.

Referring to FIG. 3A and FIG. 3B at the same time, the main difference between a detection device 10*b* of the present embodiment and the detection device 10*a* is that the switch element 200 included in the detection device 10*b* is a top-gate TFT. Specifically, the gate G is disposed on, for example, the gate insulating layer GI and located above the semiconductor layer SE. The semiconductor layer SE is partially covered, for example, by the gate insulating layer GI. That is, the gate insulating layer GI has a through hole GI_OP1 and a through hole GI_OP2 exposing a portion of the semiconductor layer SE, and the through hole IL1_OP1 and the through hole IL1_OP2 included in the insulating layer IL1 communicate with the through hole GI_OP1 and the through hole GI_OP2 included in the gate insulating layer GI, respectively, so that the insulating layer IL1 and the gate insulating layer GI may together expose a portion of the semiconductor layer SE. The source S may be coupled to the semiconductor layer SE via, for example, the through hole GI_OP1 and the through hole IL1_OP1, and the drain D may be coupled to the semiconductor layer SE via, for example, the through hole GI_OP2 and the through hole IL1_OP2. Specifically, for example, the semiconductor layer SE has a channel region CH and a source region SR and a drain region DR located on opposite sides of the channel region CH, wherein the channel region CH and the gate G are overlapped in the top view direction n of the substrate 100, and the source S and the drain D may each be coupled to the source region SR and the drain region DR of the semiconductor layer SE via through holes penetrating through the gate insulating layer GI and the insulating layer IL1. In the present embodiment, the width BW of the voltage line BL is greater than a width GW of the gate G. For example, in any cross-sectional view of the detection device 10b, for example, in a cross-sectional view parallel to the extending direction of the scan line SL (i.e., the first direction d1), the width BW of the voltage line BL is greater than the width GW of the gate G.

Figure 4A:
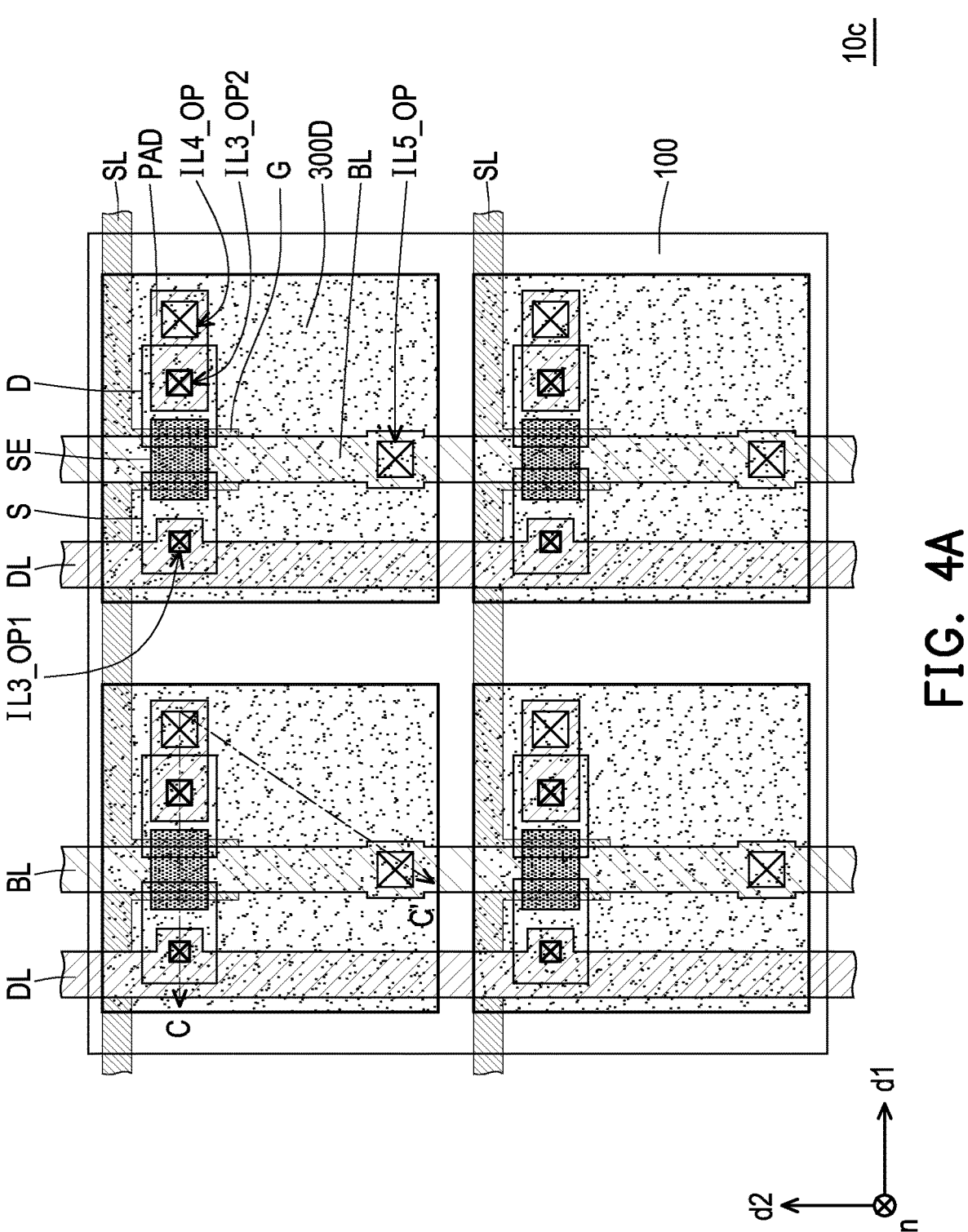
FIG. 4A is a schematic partial top view of a detection device of another embodiment of the disclosure.
Figure 4B:
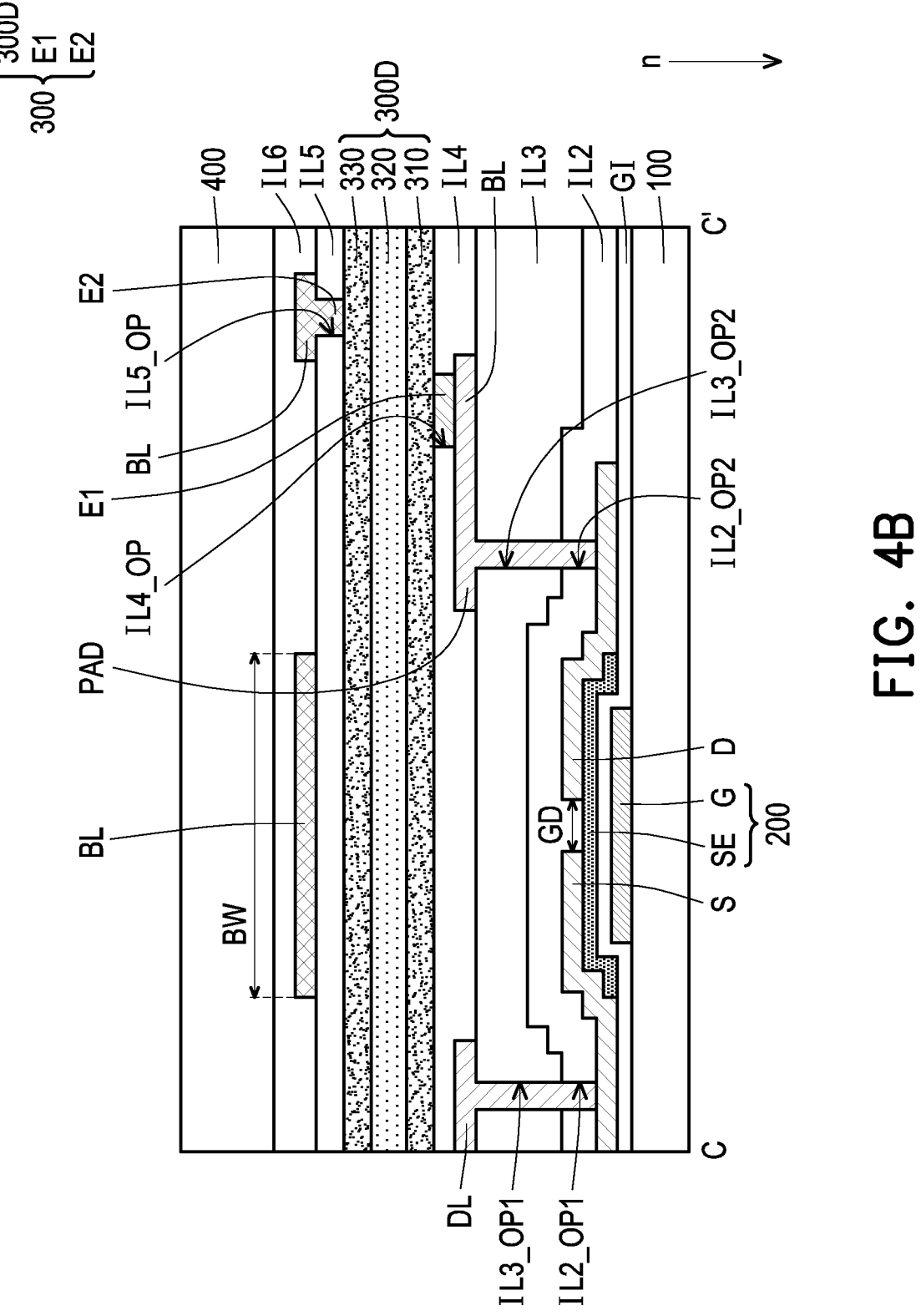
FIG. 4B is a schematic cross-sectional view along section line C-C' of FIG. 4A.

FIG. 4A is a partial top schematic view of a detection device of another embodiment of the disclosure, and FIG. 4B is a schematic cross-sectional view according to section line C-C' of FIG. 4A. It should be mentioned that, the embodiments of FIG. 4A and FIG. 4B may respectively adopt the reference numerals of the embodiments of FIG. 2A and FIG. 2B and a portion of the contents thereof, wherein the same or similar numerals are used to represent the same or similar elements and descriptions of the same technical contents are omitted.

Referring to FIG. 4A and FIG. 4B at the same time, the main difference between a detection device 10c of the present embodiment and the detection device 10a is that the voltage line BL and the switch element 200 are disposed on opposite sides of the photoelectric element 300.

Specifically, the voltage line BL is, for example, disposed on the insulating layer IL5, and the insulating layer IL5 has a through hole IL5_OP to expose a portion of the second layer 330 of the photoelectric element 300, wherein the voltage line BL may be coupled to the second layer 330 of the photoelectric element 300 via the electrode E2 disposed in the through hole IL5_OP. Moreover, the first layer 310 of the photoelectric element 300 is coupled to the electrode E1, the electrode E1 is coupled to the pad PAD via the through hole IL4 OP of the insulating layer IL4, the pad PAD is further coupled to the drain D, and the drain D is further coupled to the switch element 200, so that the switch element 200 is coupled to the first layer 310 of the photoelectric element 300.

In addition, in the present embodiment, the insulating layer IL1 is not disposed between the source S and the drain D and the semiconductor layer SE. Therefore, the source S and the drain D are in direct contact with and coupled to the semiconductor layer SE, but the disclosure is not limited thereto.

In the present embodiment, the detection device 10c further includes the voltage line BL. The voltage line BL is disposed on, for example, the switch element 200. In some embodiments, in the top view direction of the detection device 10 (e.g., the top view direction n of the substrate 100), the voltage line BL and the switch element 200 are at least partially overlapped. In detail, the voltage line BL may be disposed on the insulating layer IL5, for example, and at least partially overlapped with the semiconductor layer SE in the switch element 200 in the top view direction n of the substrate 100. Since the material of the voltage line BL may include a conductor with lower light transmittance, when the voltage line BL is at least partially overlapped with the semiconductor layer SE in the switch element 200 in the top view direction n of the substrate 100, the situation that the semiconductor layer SE affects the electrical properties of the switch element 200 due to external ambient light irradiation may be alleviated. In the present embodiment, the width BW of the voltage line BL is greater than the spacing GD between the source S and the drain D. For example, in any cross-sectional view of the detection device 10c, for example, in a cross-sectional view parallel to the extending direction of the scan line SL (i.e., the first direction d1), the width BW of the voltage line BL is greater than the spacing GD between the source S and the drain D.

In the present embodiment, the detection device 10c further includes an insulating layer IL6. For example, the insulating layer IL6 is disposed on the insulating layer IL5 and covers the voltage line BL, wherein the scintillator 400 is disposed on the insulating layer IL6. For the material of the insulating layer IL6, reference may be made to the material of the insulating layer ILL and is not repeated herein.

According to the above, the photoelectric element in the detection device of an embodiment of the disclosure includes a monocrystalline material or a polycrystalline material, so that the situation of capturing the carrier generated in the photoelectric element may be alleviated. Therefore, the detection performance of the detection device of an embodiment of the disclosure may be improved.

Although the disclosure has been described with reference to the above embodiments, it will be apparent to one of the ordinary skill in the art that modifications and variations to the described embodiments may be made without departing from the spirit and scope of the disclosure. Accordingly, the scope of the disclosure will be defined by the attached claims not by the above detailed descriptions.

What is claimed is:

1. A detection device, comprising:
a substrate;
a switch element disposed on the substrate and comprising a gate, a source and a drain;
a photoelectric element disposed on the substrate and coupled to the switch element, the photoelectric element comprises a semiconductor;
a scintillator at least partially overlapped with the photoelectric element in a top view direction of the detection device; and
a voltage line, disposed on the substrate and coupled to the photoelectric element, wherein in a cross-sectional view of the detection device, the voltage line overlaps a spacing between the source and the drain, and a width of the voltage line is greater than a width of the gate, wherein the semiconductor of the photoelectric element comprises gallium arsenide.

2. The detection device of claim 1, wherein the photoelectric element comprises a chip.

3. The detection device of claim 1, wherein the voltage line and the switch element are located on a same side of the photoelectric element.

4. The detection device of claim 1, wherein the photoelectric element comprises a first electrode and a second electrode, the first electrode is coupled to the switch element, and the second electrode is coupled to the voltage line.

5. The detection device of claim 1, wherein in the top view direction of the detection device, the voltage line and the switch element are at least partially overlapped.

6. The detection device of claim 1, wherein the voltage line and the switch element are respectively located on opposite sides of the photoelectric element.

7. The detection device of claim 1, wherein the switch element has a bottom-gate structure, and in the cross-sectional view of the detection device, the width of the voltage line is greater than the spacing between the source and the drain.

8. The detection device of claim 1, further comprising a scan line and a data line, wherein the scan line and the data line are each coupled to the switch element.

9. The detection device of claim 1, wherein the semiconductor comprises a first layer, an intrinsic layer, and a second layer, and the intrinsic layer is disposed between the first layer and the second layer.

10. The detection device of claim 9, wherein the intrinsic layer comprises a gallium arsenide multiple quantum well semiconductor.

11. The detection device of claim 9, wherein the photoelectric element comprises a first electrode and a second electrode, the first electrode is coupled to the switch element, and the second electrode is coupled to the voltage line.

12. The detection device of claim 11, wherein the first electrode is coupled to the first layer, and the second electrode is coupled to the second layer.

13. The detection device of claim 11, wherein the first electrode is coupled to the second layer, and the second electrode is coupled to the first layer.

14. The detection device of claim 1, wherein a material of the scintillator comprises $Lu_2S_3{:}Ce^{3+}$, $LaBr_3{:}PR^{3+}$, $CsI{:}TI$, $Y_3Al_5O_{12}{:}Ce$, $Lu_3Al_5O_{12}{:}Ce$, $Bi_4Ge_3O_{12}$, $PbWO_4$, $Gd_2SiO_5{:}Ce$, or a combination thereof.

15. The detection device of claim 1, wherein the switch element further comprises a semiconductor layer, and the semiconductor layer is at least partially overlapped with the gate in the top view direction of the detection device.

16. The detection device of claim 15, wherein in the top view direction of the detection device, the voltage line and the switch element are at least partially overlapped.

\* \* \* \* \*